United States Patent
Sato

(10) Patent No.: US 10,249,545 B2
(45) Date of Patent: Apr. 2, 2019

(54) METHOD FOR PROCESSING SUBSTRATE INCLUDING FORMING A FILM ON A SILICON-CONTAINING SURFACE OF THE SUBSTRATE TO PREVENT RESIST FROM EXTRUDING FROM THE SUBSTRATE DURING AN IMPRINTING PROCESS

(71) Applicant: TOSHIBA MEMORY CORPORATION, Tokyo (JP)

(72) Inventor: Nobuyoshi Sato, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/066,667

(22) Filed: Mar. 10, 2016

(65) Prior Publication Data

US 2017/0040231 A1  Feb. 9, 2017

(30) Foreign Application Priority Data

Aug. 4, 2015 (JP) ................. 2015-154422

(51) Int. Cl.
  *H01L 21/02* (2006.01)
  *H01L 21/027* (2006.01)
  *H01L 21/66* (2006.01)

(52) U.S. Cl.
  CPC .......... *H01L 22/20* (2013.01); *H01L 21/0273* (2013.01); *H01L 21/02126* (2013.01); *H01L 21/02167* (2013.01); *H01L 21/02252* (2013.01); *H01L 21/02255* (2013.01)

(58) Field of Classification Search
  None
  See application file for complete search history.

(56) References Cited

U.S. PATENT DOCUMENTS

| | | | |
|---|---|---|---|
| 5,985,363 A * | 11/1999 | Shiau | H01L 21/312 257/E21.259 |
| 7,794,923 B2 | 9/2010 | Shiobara et al. | |
| 7,972,960 B1 | 7/2011 | Suguro et al. | |
| 8,178,983 B2 | 5/2012 | Ishibashi et al. | |
| 8,946,093 B2 | 2/2015 | Mikami | |
| 9,260,300 B2 | 2/2016 | Matsunaga et al. | |
| 2007/0134591 A1 * | 6/2007 | Yamaguchi | G03F 7/0046 430/270.1 |
| 2008/0241489 A1 | 10/2008 | Ishibashi et al. | |

(Continued)

FOREIGN PATENT DOCUMENTS

| | | |
|---|---|---|
| JP | 2003-77807 A | 3/2003 |
| JP | 2007-19465 | 1/2007 |

(Continued)

*Primary Examiner* — Jay C Chang

(74) *Attorney, Agent, or Firm* — Finnegan, Henderson, Farabow, Garrett & Dunner, L.L.P.

(57) ABSTRACT

A method for processing a substrate exposes a silicon-containing surface at a circumferential edge portion of a first main surface of a substrate to be processed, performs surface processing to the silicon-containing surface to increase a contact angle of the silicon-containing surface with respect to a resist material, comparing with the contact angle before the surface processing is performed, supplies the resist material onto the substrate to be processed after the surface processing, and transfers a template pattern to the resist material.

11 Claims, 4 Drawing Sheets

(56) References Cited

U.S. PATENT DOCUMENTS

| | | | | |
|---|---|---|---|---|
| 2010/0006324 A1* | 1/2010 | Kitamura | ............. | C08K 3/0033 |
| | | | | 174/255 |
| 2010/0232781 A1* | 9/2010 | Hontake | ............... | G03F 7/0035 |
| | | | | 396/611 |
| 2012/0149211 A1* | 6/2012 | Ojima | .................... | B82Y 10/00 |
| | | | | 438/758 |
| 2013/0078820 A1* | 3/2013 | Mikami | ................ | G03F 7/0002 |
| | | | | 438/778 |
| 2013/0280836 A1* | 10/2013 | Ghosh | ................. | H01L 51/0004 |
| | | | | 438/29 |
| 2014/0180395 A1* | 6/2014 | Wu | ......................... | A61L 31/10 |
| | | | | 623/1.15 |
| 2014/0199808 A1* | 7/2014 | Sugimoto | ........... | H01L 51/0011 |
| | | | | 438/99 |
| 2014/0213058 A1* | 7/2014 | Matsunaga | ........... | G03F 7/0002 |
| | | | | 438/694 |
| 2016/0091711 A1* | 3/2016 | Tauk | .................... | G02B 26/005 |
| | | | | 359/290 |
| 2016/0263814 A1* | 9/2016 | Youn | ..................... | G03F 7/0002 |

FOREIGN PATENT DOCUMENTS

| | | |
|---|---|---|
| JP | 2007-27778 A | 2/2007 |
| JP | 2011-159885 A | 8/2011 |
| JP | 2013-69919 A | 4/2013 |
| JP | 2014-146696 A | 8/2014 |
| WO | WO 2015/056487 A1 | 4/2015 |

* cited by examiner

METHOD FOR PROCESSING SUBSTRATE INCLUDING FORMING A FILM ON A SILICON-CONTAINING SURFACE OF THE SUBSTRATE TO PREVENT RESIST FROM EXTRUDING FROM THE SUBSTRATE DURING AN IMPRINTING PROCESS

CROSS REFERENCE TO RELATED APPLICATIONS

This application is based upon and claims the benefit of priority from the prior Japanese Patent Application No. 2015-154422, filed on Aug. 4, 2015, the entire contents of which are incorporated herein by reference.

FIELD

Embodiments of the present invention relate to a method for processing a substrate.

BACKGROUND

An imprinting method has attracted attention as a technique for forming a fine pattern. In the imprinting method, an imprinting template including an uneven pattern formed thereon is contacted with resist coated on a base substrate. After the resist has cured, the template is released from the resist so that a resist pattern is formed on the base substrate. The base substrate is processed with the resist pattern as a mask so that a fine pattern is formed on the base substrate.

In the imprinting method, it is assumed that processing for forming the resist pattern on a wafer is repeated while the template is moved on the wafer. In order to improving a yield, the resist pattern is preferably formed so as to be close to an edge of the wafer. However, in the imprinting method, since the template is pressed to the resist, part of the resist extrudes to the outside of the template. The template pattern is not filled with the resist due to the extrusion. As a result, an imprinting defect occurs. In addition, in some cases, the resist that has extruded adheres to an outer circumferential surface of the wafer near the edge of the wafer and passes along the outer circumferential surface. Thus, there is a risk that the resist adheres to the side of a back surface of the wafer.

The resist that has adhered to the outer circumferential surface or the side of the back surface of the wafer, is not removed by a typical resist removing processing. Thus, the resist causes contamination of the wafer. For example, when the resist adheres to the outer circumferential surface of the wafer, the resist is transferred to a robot arm that conveys the wafer. When the robot arm holds another wafer, there is a risk that the resist is re-transferred to the wafer. When the resist adheres to the side of the back surface of the wafer, there is a risk that a defect occurs. For example, the resist adheres to a susceptor on which the wafer is mounted, or the wafer is mounted so as to tilt with respect to a horizontal plane of the susceptor.

DETAILED DESCRIPTION

According to one embodiment, a method for processing a substrate exposes a silicon-containing surface at a circumferential edge portion of a first main surface of a substrate to be processed, performs surface processing to the silicon-containing surface to increase a contact angle of the silicon-containing surface with respect to a resist material, comparing with the contact angle before the surface processing is performed, supplies the resist material onto the substrate to be processed after the surface processing, and transfers a template pattern to the resist material.

Embodiments of the present invention will be described below with reference to the drawings. According to each of the embodiments to be described below, a fine pattern is formed on a wafer by an imprinting process. In the imprinting process, processing is repeated for forming a resist pattern by pressing a template including a fine pattern formed thereon, to resist on one main surface of a wafer while the template is moved on the one main surface of the wafer. When the template is pressed to the resist near an edge of the wafer, there is a risk that the resist extrudes to an outer circumferential surface or the side of a back surface of the wafer. Therefore, according to the present embodiment, processing for modifying a surface of a circumferential edge portion of the wafer is arranged in the imprinting process in order to prevent the resist from extruding to the outer circumferential surface or the side of the back surface of the wafer. Here, the circumferential edge portion is in a range of 1.5 mm from the edge (outer circumferential surface) to the inner circumferential side, for example, in a case where the wafer has a size of 300 mm. Note that, the range of the circumferential edge portion may be arbitrarily set.

First Embodiment

Figure 1:
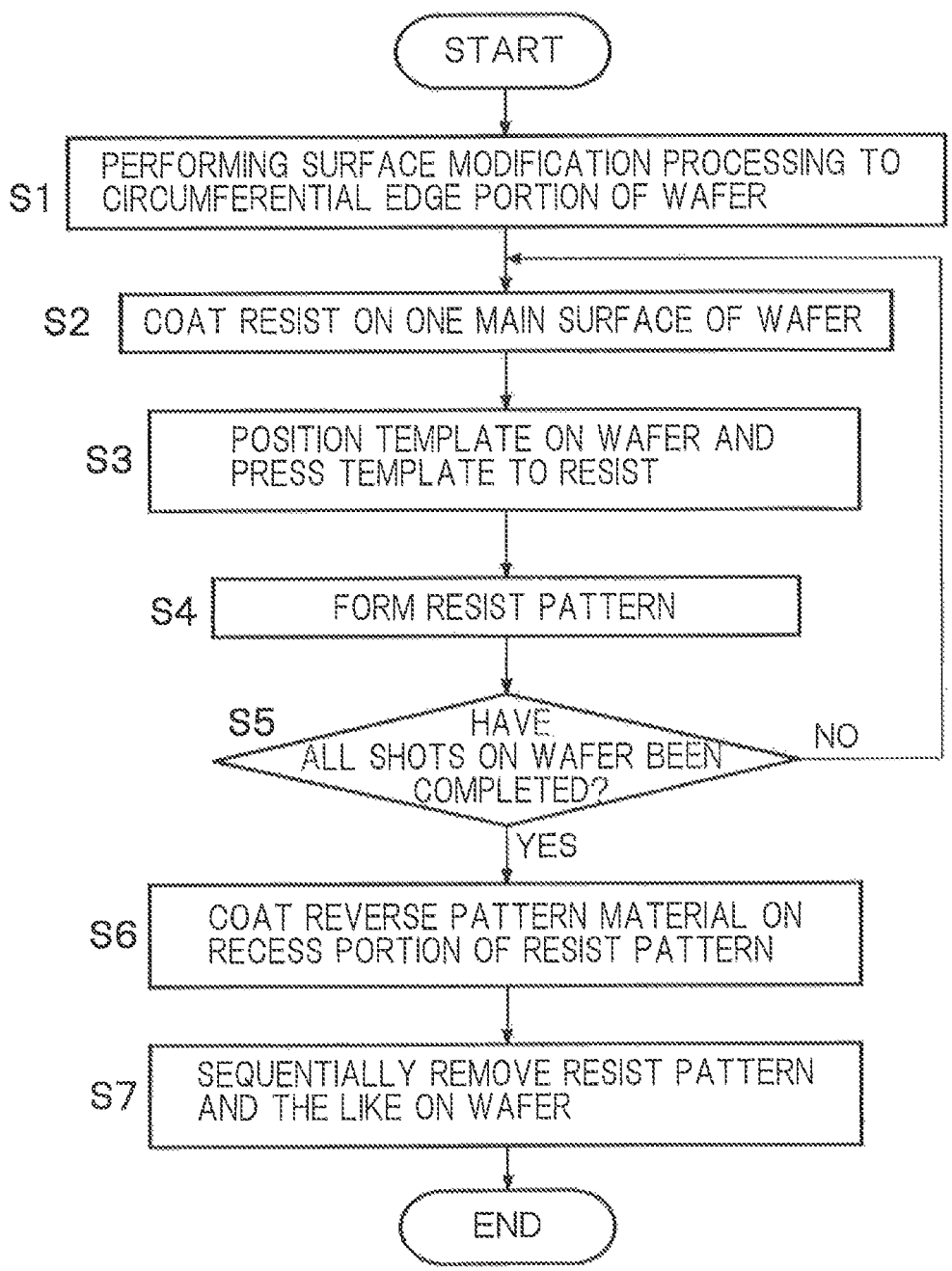
FIG. 1 is a flow chart of an example of processing processes in an imprinting process according to a first embodiment.

FIG. 1 is a flow chart of an example of processing processes in an imprinting process according to a first embodiment. FIGS. 2A to 2F are cross-sectional views of processes of a fine pattern formed by the imprinting process.

First, processing for modifying a surface of a circumferential edge portion of a wafer, is performed (Step S1). As described later, the processing forms a film including silicon, carbon, and fluorine having bonded together, or a film including silicon, oxygen, carbon and fluorine having bonded together on the surface of the circumferential edge portion of the wafer. The film includes SiOCFn or SiCFn (n is an integer that is 1 or more, preferably, n is 1, 2, or 3). The film has water repellency (hydrophobicity) and oil repellency, and has a property for repelling resist. Therefore, after the film has formed on the circumferential edge portion of the wafer, even when a template is pressed to the resist near the circumferential edge portion of the wafer and the resist extrudes toward the circumferential edge portion of the wafer, the resist hardly enters in the circumferential edge portion. Therefore, the resist no longer adheres to the outer circumferential surface or the side of the back surface of the wafer. Contamination of the wafer can be prevented.

After the above processing at Step S1 has been completed, a primary imprinting process is started.

Note that, the processing at Step S1 may be continuously performed to a plurality of wafers before the imprinting. A housing unit may house the plurality of wafers each including a circumferential edge portion to which surface modification processing has been performed. The plurality of wafers may be collected from the housing unit one by one. The processings after Step S2 to be described later may be performed. As described above, the processing at Step S1 is collectively performed to the plurality of wafers. Thus, throughput of the imprinting process can be improved.

Figure 2A:
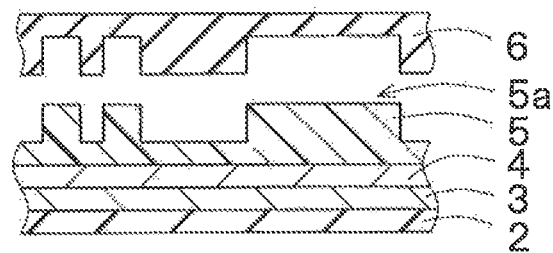
FIG. 2A is a cross-sectional view of a process of a fine pattern formed by the imprinting process.

In an example in FIG. 2A, a silicon oxide film 2, an amorphous silicon layer 3, a carbon layer 4, and a resist film 5 are disposed, in this order, on a wafer 1 including a silicon substrate (not illustrated in FIGS. 2A to 2F). Types of layers to be disposed are arbitrary. In the example in FIG. 2A, the processing at Step S1 is to be performed after the silicon oxide film 2, amorphous silicon layer 3, and the carbon layer 4 have been formed on the wafer 1.

After the processing at Step S1 has been completed, several drops of resist 5 are coated and formed on the one main surface of the wafer 1 (Step S2). The resist 5 is a photo-curable resist that are cured by ultra violet (UV) light.

Next, the template 6 is positioned on the one main surface of the wafer 1. Then, the template 6 is pressed to the resist 5 on the one main surface of the wafer 1 (Step S3). Accordingly, the resist 5 flows along a shape of an uneven pattern of the template 6. Part of the resist 5 enters inside a recess portion of the uneven pattern. Since the surface of the circumferential edge portion of the wafer 1 has been modified at Step S1 described above, the resist 5 barely flows toward the outside of the circumferential edge portion of the wafer 1. The resist remains inside the circumferential edge portion. In this state, UV light is irradiated from the upper side of the template 6 so as to cure the resist 5.

After the resist 5 has cured, when the template 6 is separated from the resist 5, a resist pattern 5a to which the uneven pattern of the template 6 has been transferred, is formed (Step S4, refer to FIG. 2A). As a result, an imprint for one shot has been completed.

Next, it is determined whether all shots have been completed in an entire sheet of the wafer 1 (Step S5). When the shots have not been completed, the processing goes back to Step S2. While a position of the template 6 is moved on the wafer 1, the imprinting is repeated for each shot.

Figure 2B:
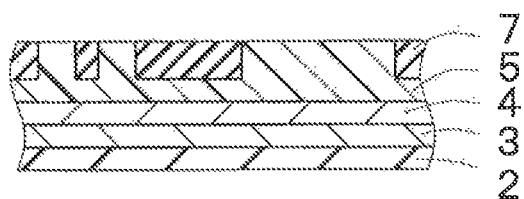
FIG. 2B is a cross-sectional view of a process of the fine pattern formed by the imprinting process.
Figure 2C:
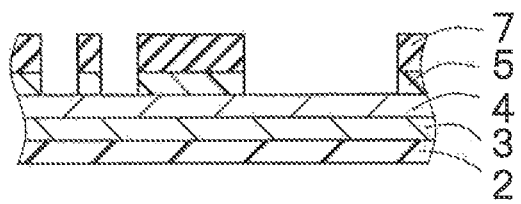
FIG. 2C is a cross-sectional view of a process of the fine pattern formed by the imprinting process.
Figure 2D:
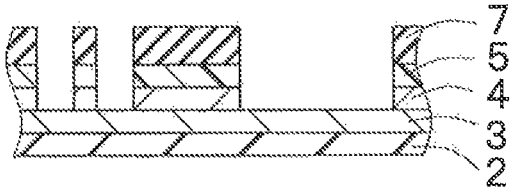
FIG. 2D is a cross-sectional view of a process of the fine pattern formed by the imprinting process.
Figure 2E:
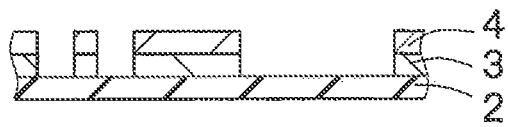
FIG. 2E is a cross-sectional view of a process of the fine pattern formed by the imprinting process.
Figure 2F:
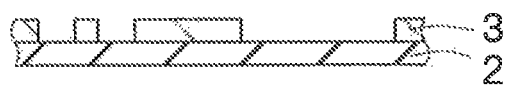
FIG. 2F is a cross-sectional view of a process of the fine pattern formed by the imprinting process.

At Step S5, when it is determined that all the shots have been completed, a reverse pattern material 7 is coated on a recess portion of the resist pattern 5a (Step S6, refer to FIG. 2B). The reverse pattern material 7 is a spin on glass (SOG) film 7 including a silicon oxide film. The wafer 1 is coated with the reverse pattern material 7 while the wafer 1 is rotated. The reverse pattern material 7 is filled in the recess portion of the resist pattern 5a by spin coating.

Next, the resist pattern 5a exposed on a surface of the wafer 1, the carbon layer 4, and the amorphous silicon layer 3 are sequentially removed by, for example, RIE using oxygen plasma (Step S7, refer to FIGS. 2C to 2F). After that, although the illustration is omitted, the silicon oxide film 2 is processed with the amorphous silicon layer 3 as a mask. Furthermore, copper wiring is embedded and formed in a processed groove of the silicon oxide film 2. In this case, the copper wiring to be semiconductor circuit wiring is not formed at the circumferential edge portion of the wafer 1. The copper wiring to be the semiconductor circuit wiring is formed inside the circumferential edge portion.

Figure 3:
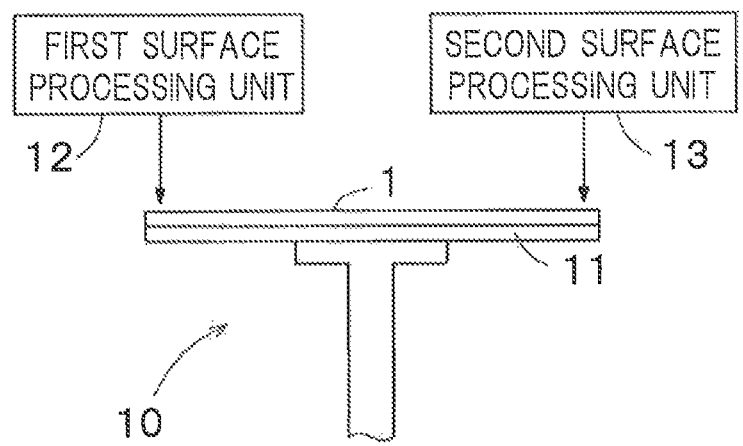
FIG. 3 is a block diagram of a schematic configuration of a substrate processing apparatus for performing surface modification processing at Step S1 in FIG. 1.

FIG. 3 is a block diagram of a schematic configuration of a substrate processing apparatus 10 for performing the surface modification processing at Step S1 in FIG. 1. It is assumed that the substrate processing apparatus 10 in FIG. 3 performs the surface modification processing to the wafer 1 including silicon as a base member upon the imprinting process. However, the substrate processing apparatus 10 can be applied to other semiconductor processes other than the imprinting process. That is, the substrate processing apparatus 10 in FIG. 3 can be applied to arbitrary semiconductor processes that need to modify the surface of the circumferential edge portion of the wafer 1 and to prevent, for example, the resist from adhering to the outer circumferential surface or the side of the back surface of the wafer 1.

The substrate processing apparatus 10 in FIG. 3 includes a turntable 11 rotating the wafer 1, a first surface processing unit 12, and a second surface processing unit 13.

The first surface processing unit 12 performs processing for exposing the silicon that is the base member of the wafer 1, at the circumferential edge portion of the wafer 1. In a case where any film has been deposited on the one main surface of the wafer 1 (first main surface), the first surface processing unit 12 removes the film that has adhered to the circumferential edge portion on the one main surface of the wafer 1, and exposes the silicon. More specifically, the first surface processing unit 12 performs, for example, chemical and mechanical polishing, wet etching, and cleaning, in accordance with a type of the film that has been deposited, and exposes the silicon at the circumferential edge portion of the wafer 1. Note that in a case where a surface of any of a layered film structure formed on the circumferential edge portion of the wafer 1 contains silicon, the first surface processing unit 12 does not necessarily remove all the layered film structure to expose a surface of the base member of the wafer 1. In this case, a silicon-containing film on the circumferential edge portion of the wafer 1 is exposed. The second surface processing unit 13 performs surface processing to the silicon-containing film. Thus, extrusion of the resist can be prevented. The same is said in the following embodiment.

With respect to the silicon exposed at the circumferential edge portion of the wafer 1, the second surface processing unit 13 supplies CF based gas containing carbon and fluorine and performs plasma excitation or thermal excitation, or vaporizes a CF based solvent. Accordingly, a chemical reaction is generated between the silicon exposed at the circumferential edge portion of the wafer 1 and $CF_4$. Thus, an SiOCFn film or an SiCFn film (n=1, 2, or 3) is generated.

Figure 4:
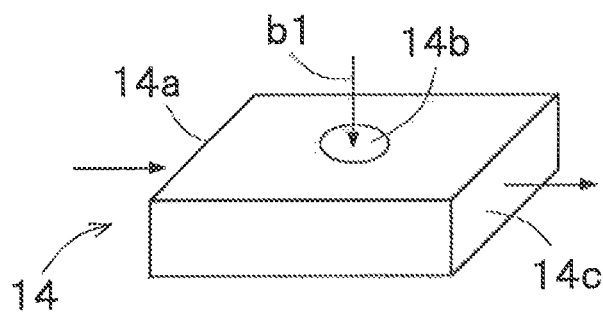
FIG. 4 is a view for describing thermal excitation of CF based gas.

FIG. 4 is a view explaining the thermal excitation of the CF based gas. In an example in FIG. 4, a gas housing unit 14 is disposed near the circumferential edge portion of the wafer 1. The gas housing unit 14 includes an inlet 14a into which the CF based gas, such as $CF_4$, flows, a quartz-made window 14b from which a laser beam b1 is irradiated into the gas housing unit 14, and an outlet 14c from which the gas discharges, the gas to which the thermal excitation has been performed by the laser beam b1. When the laser beam b1 having a predetermined wavelength is irradiated to the CF based gas housed from the inlet 14a in the gas housing unit 14, the thermal excitation is performed to the CF based gas. Then, the CF based gas ionizes. The gas that has ionized discharges from the outlet 14c. A chemical reaction is generated between the silicon exposed at the circumferential edge portion of the wafer 1 and the gas that has ionized. Then, an SiOCFn film or an SiCFn film is formed.

The surface processing by the first surface processing unit 12 and the second surface processing unit 13 can be performed at a predetermined temperature (for example, 150 to 700° C.) in the same chamber. Therefore, even when moisture adsorbs on the surface of the wafer 1 due to the processing by the first surface processing unit 12, the moisture that has adsorbed can desorb before the second surface processing unit 13 performs the processing. Therefore, the processing of the second surface processing unit 13 can stably form the SiOCFn film or the SiCFn film on a surface of the outer circumferential surface of the wafer 1.

Figure 5:
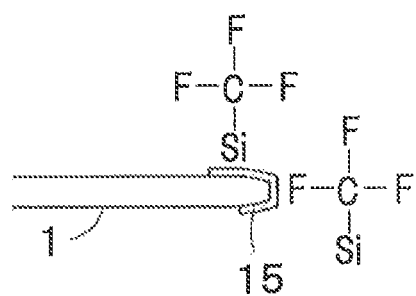
FIG. 5 is a schematic cross-sectional view of a wafer to which a second surface processing unit has performed processing.

FIG. 5 is a schematic cross-sectional view of the wafer 1 to which the second surface processing unit 13 has performed the processing. In an example in FIG. 5, the processing of the second surface processing unit 13 forms an $SiCF_3$ film 15 at the circumferential edge portion of the wafer 1. The SiOCFn film and the SiCFn film (n=1, 2, or 3) including the $SiCF_3$ film 15 have the water repellency and the oil repellency. Thus, the processing of the second surface processing unit 13 is performed so that the resist barely adheres to the circumferential edge portion of the wafer 1.

As described above, each of the processings of the first surface processing unit 12 and the second surface processing unit 13 can be performed at a temperature of from 150 to 700° C. Thus, even when the processing of the first surface processing unit 12 uses water, the water can be dehydrated by heating. There is no risk that remaining water has an adverse effect on the processing of the second surface processing unit 13. Alternatively, dehydrating-high-temperature-heat processing for actively desorbing the moisture that has adhered to the surface of the wafer 1, may be performed between the processing of the first surface processing unit 12 and the processing of the second surface processing unit 13.

As described above, according to the first embodiment, before the processing for pressing the template 6 to the resist on the wafer 1 in the imprinting process, the processing for forming the SiOCFn film or the SiCFn film at the circumferential edge portion of the wafer 1 is performed. Therefore, even when the template 6 is pressed to the resist on the wafer 1 near the circumferential edge portion of the wafer 1, the resist can be prevented from intruding to the circumferential edge portion of the wafer 1. Accordingly, in the imprinting process, a defect that the resist adheres to the outer circumferential surface and the back surface of the wafer 1, can be prevented.

Second Embodiment

According to a second embodiment, a surface of a circumferential edge portion of a wafer 1 is modified by a method different from that according to the first embodiment.

Figure 6A:
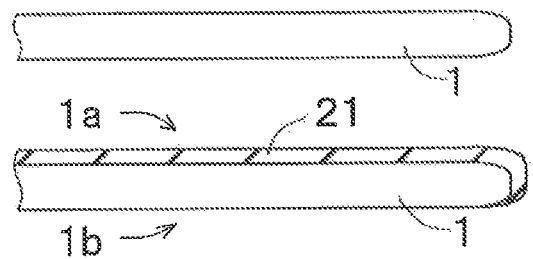
FIG. 6A is a cross-sectional view of a process of surface modification processing according to a second embodiment.

According to the second embodiment, a processing detail of Step S1 illustrated in FIG. 1 is different from that according to the first embodiment. FIGS. 6A to 6D are cross-sectional views of processes of surface modification processing according to the second embodiment. First, as illustrated in FIG. 6A, a predetermined film (for example, silicon oxide film 21) is formed on an entire one main surface of the wafer 1 (first main surface 1a) by chemical vapor deposition (CVD) using a vapor phase growth apparatus.

Figure 6B:
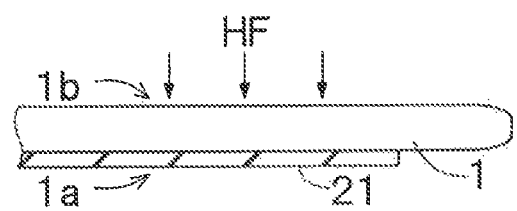
FIG. 6B is a cross-sectional view of a process following the process in FIG. 6A.

Next, as illustrated in FIG. 6B, the wafer 1 is reversed, namely, the silicon oxide film 21 is faced downward and is mounted on a turntable 11. Then, while the wafer 1 is rotated, liquid hydrofluoric acid (HF) is dropped on a second main surface 1b from the upper side of the second main surface 1b on the opposite side of the first main surface 1a of the wafer 1. Accordingly, part of the hydrofluoric acid passes along an outer circumferential surface of the wafer 1 so as to also go around to the first main surface 1a. Therefore, the silicon oxide film 21 that has been formed at the circumferential edge portion of the first main surface 1a of the wafer 1 is removed.

Figure 6C:
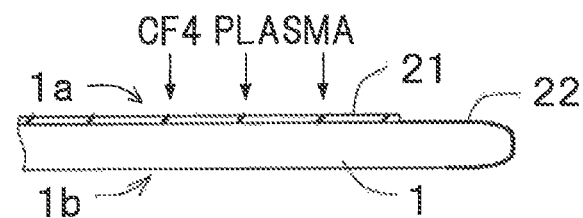
FIG. 6C is a cross-sectional view of a process following the process in FIG. 6B.

Next, as illustrated in FIG. 6C, CF based gas to which plasma excitation or thermal excitation has been performed, or a CF based solvent that has been vaporized, is supplied to the first main surface 1a of the wafer 1.

Accordingly, like the first embodiment, an SiOCFn film or an SiOCFn film (n is 1, 2, or 3) 22 is formed at the circumferential edge portion of the first main surface 1a of the wafer 1. In this case, a thin film of the silicon oxide film 21 is arranged so as to remain on the inner circumferential side of the circumferential edge portion of the wafer 1. The amount and the time period of supplying the CF based gas, and a ratio of mixing H2 etc. to the CF based gas are controlled so that this arrangement can be relatively easily performed.

As described above, according to the second embodiment, the silicon at the circumferential edge portion of the wafer 1 is exposed using hydrofluoric acid generally used in a cleaning process in a semiconductor process. After that, the surface modification can be performed to the circumferential edge portion using the CF based gas or the CF based solvent.

Third Embodiment

According to a third embodiment, a shielding plate is prepared and surface modification is performed to a circumferential edge portion of the wafer 1.

Figure 7:
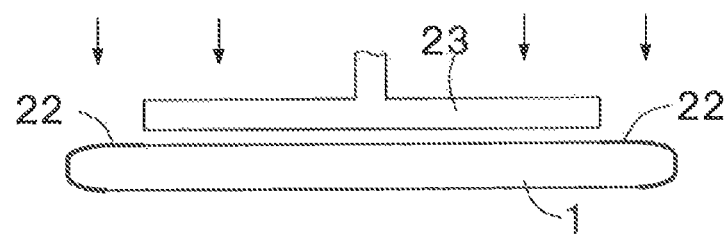
FIG. 7 is a view of a surface modification method for a circumferential edge portion of a wafer according to a third embodiment.

FIG. 7 is a view of a surface modification method for the circumferential edge portion of the wafer 1 according to the third embodiment. According to the third embodiment, processing of a first surface processing unit 12 is performed as in the first and second embodiments. Processing of the second surface processing unit 13 is different from those according to the first and second embodiments.

The second surface processing unit 13 according to the third embodiment uses the shielding plate 23 having a diameter slightly smaller than an outer diameter of the wafer 1. The shielding plate 23 is disposed adjacent to one main surface of the wafer 1. In this case, it is necessary to position a center position of the shielding plate 23 and a center position of the wafer 1 together. An outer dimension of the shielding plate 23 is substantially the same as an inner diameter of the circumferential edge portion of the wafer 1. Therefore, in a case where the wafer 1 and the shielding plate 23 are vertically disposed in a state where the center positions of the wafer 1 and the shielding plate 23 have been overlapped with each other, only the circumferential edge portion of the wafer 1 does not overlap. Therefore, when CF based gas is supplied or a CF based solvent that has been vaporized is supplied from the upper side of the one main surface of the wafer 1, the above SiOCFn film or the above SiCFn film can be formed only at the circumferential edge portion of the wafer 1.

For example, according to the first embodiment, it is necessary to perform positioning control for performing the processing to only the circumferential edge portion of the wafer 1 by the second surface processing unit 13. However, according to the third embodiment, since the shielding plate 23 covers other portions other than the circumferential edge portion of the wafer 1. Therefore, there is no need for the above positioning control.

Note that, the processing by the first surface processing unit 12 may be performed using the shielding plate 23 illustrated in FIG. 7. In a case where the shielding plate 23 is used, for example, an etchant or a cleaning solvent may be dropped on a first main surface 1a of the wafer 1 from the upper side of the shielding plate 23 so that cleaning and etching may be performed to only the circumferential edge portion of the wafer 1.

Accordingly, according to the third embodiment, preparing the shielding plate 23 facilitates the positioning control for performing the surface modification to only the circumferential edge portion of the wafer 1.

The surface modification processing to the circumferential edge portion of the wafer 1 according to each of the first to third embodiments that have been described above, may be performed to the entire circumferential edge portion of the wafer 1 or only a part of the circumferential edge portion of the wafer 1. In a case where the surface modification processing is performed to the entire circumferential edge portion of the wafer 1, the above processings of the first surface processing unit 12 and the second surface processing unit 13 may be performed while the wafer 1 is rotated. In a case where the surface modification processing is performed to only the part of the circumferential edge portion of the wafer 1, the processings may be performed in a state where the wafer 1 is placed to be stationary. The surface modification processing may be processing for increasing, for example, a contact angle of a silicon-containing surface that is a surface of an object to which the modification processing is performed, with respect to a resist film, when compared to that before the surface modification processing is performed. The surface modification processing may not necessarily be processing for supplying the CF based gas.

EXAMPLES

Example 1

Silicon that was a base member of a wafer 1 was exposed only at a circumferential edge portion of the wafer 1 having a size of 300 mm (range of 1.5 mm from an outer circumferential surface to the inner circumferential side of the wafer 1), by polishing and cleaning. Next, $CF_4$ gas was introduced to a metal-made gas housing unit 14 disposed on a part of the circumferential edge portion of the wafer 1. After that, a laser beam was irradiated from a quartz-made window on the upper side of the gas housing unit 14 so that $CF_4$ was ionized by heating and excitation. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 65 deg. Accordingly, it could be confirmed that surface modification for repelling the resist had been performed.

Example 2

Silicon that was a base member of a wafer 1 was exposed only at a circumferential edge portion of the wafer 1 having a size of 300 mm (range of 1.5 mm from an outer circumferential surface to the inner circumferential side of the wafer 1), by wet etching. Next, $CF_4$ gas was introduced to a metal-made gas housing unit 14 disposed on a part of the circumferential edge portion of the wafer 1. After that, a laser beam was irradiated from a quartz-made window on the upper side of the gas housing unit 14 so that $CF_4$ was ionized by heating and excitation. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 65 deg.

Example 3

Silicon that was a base member of a wafer 1 was exposed only at a circumferential edge portion of the wafer 1 having a size of 300 mm (range of 1.5 mm from an outer circumferential surface to the inner circumferential side of the wafer 1), by wet etching. Next, $CF_4$ gas was introduced to a metal-made gas housing unit 14 disposed on a part of the circumferential edge portion of the wafer 1. After that, a laser beam was irradiated from a quartz-made window on the upper side of the gas housing unit 14 so that a temperature of the circumferential edge portion of the wafer 1 was increased to 300° C. and the circumferential edge portion of the wafer 1 was dehydrated by heating and excitation. Next, the laser beam ionized $CF_4$. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 70 deg.

Example 4

Silicon that was a base member of a wafer 1 was exposed only at a circumferential edge portion of the wafer 1 having a size of 300 mm (range of 1.5 mm from an outer circumferential surface to the inner circumferential side of the wafer 1), by wet etching. Next, a laser beam was irradiated, from a quartz-made window on the upper side of a metal-made gas housing unit 14, to a gas housing unit 14 disposed on a part of the circumferential edge portion of the wafer 1. A temperature of the circumferential edge portion of the wafer 1 was increased to 300° C. and the circumferential edge portion of the wafer 1 was dehydrated by heating and excitation. Next, a vaporized CF based solvent was introduced into the gas housing unit 14, while continuing the laser irradiation. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 70 deg.

Example 5

Silicon that was a base member of a wafer 1 was exposed only at a circumferential edge portion of the wafer 1 having a size of 300 mm (range of 1.5 mm from an outer circumferential surface to the inner circumferential side of the wafer 1), by wet etching. Next, a shielding plate 23 was disposed facing an element forming region other than the circumferential edge portion of the wafer 1, at an interval of 0.03 mm from the wafer 1. Next, atmospheric pressure plasma ionized $CF_4$ gas. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 70 deg.

Example 6

Silicon that was a base member of a wafer 1 was exposed only at a circumferential edge portion of the wafer 1 having a size of 300 mm (range of 1.5 mm from an outer circumferential surface to the inner circumferential side of the wafer 1), by wet etching. Next, a shielding plate 23 was disposed facing an element forming region other than the circumferential edge portion of the wafer 1, at an interval of 0.03 mm from the wafer 1. Next, the wafer 1 was heated at 300° C. and dehydrated. After that, atmospheric pressure plasma ionized $CF_4$ gas. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 70 deg.

Comparative Example 1

A water repellent and oil repellent surface layer including SiCFn (n=1, 2, or 3) was formed on an entire wafer 1 having a size of 300 mm. Upon imprinting, resist was not adsorbed on the wafer 1 and a resist pattern 5*a* was also not formed.

Comparative Example 2

Silicon that was a base member of a wafer 1 was exposed only at a circumferential edge portion of the wafer 1 having a size of 300 mm (range of 1.5 mm from an outer circumferential surface to the inner circumferential side of the wafer 1) to which resist exposure (Edge Bead Removal: EBR) had been performed, by wet etching. Next, a laser beam was irradiated to the circumferential edge portion of the wafer 1. After that, laser thermal excitation ionized $CF_4$. Accordingly, a chemical reaction was generated between the silicon exposed at the circumferential edge portion of the wafer 1 and the $CF_4$. A water repellent and oil repellent surface layer including SiCFn (n=1, 2, or 3) was formed. A contact angle of resist with respect to the water repellent and oil repellent surface layer that had been acquired, was measured as 50 deg. Heat caused by the laser thermal excitation transmitted to a device region. The resist that had been coated on a device surface, remained. Therefore, a yield degraded.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method for processing a substrate, comprising:
exposing a silicon-containing surface at a circumferential edge portion of a first main surface of a substrate to be processed;
performing surface processing to the silicon-containing surface to increase a contact angle of the silicon-containing surface with respect to a resist material, comparing with the contact angle before the surface processing is performed;
supplying the resist material in sequence onto a different portion of one surface on the substrate to be processed after the surface processing;
transferring a template pattern to the resist material; and
repeating the supplying of the resist material and the transferring of the template pattern while changing a location of supplying the resist material onto the one surface on the substrate and arranging the template pattern,
wherein
the surface processing comprises forming a film on the silicon-containing surface, the film being formed by bonding silicon, carbon and fluorine, or being formed by bonding silicon, oxygen, carbon and fluorine; and
the forming of the film forms the film containing SiOCFn or SiCFn, where n is an integer that is one or more, at the circumferential edge portion that has not been covered with a shielding member, using CF based gas or a CF based solvent in a state where the shielding member is arranged on the first main surface of the substrate to be processed, the shielding member being configured to shield an inner circumferential side of the circumferential edge portion of the first main surface of the substrate to be processed.

2. The method for processing a substrate according to claim 1,
wherein the forming of the film performs plasma excitation or thermal excitation to the CF based gas including carbon and fluorine, or performs vaporization to the CF based solvent including carbon and fluorine to cause a chemical reaction with silicon and to form the film containing SiOCFn or SiCFn, where n is an integer that is one or more.

3. The method for processing a substrate according to claim 1, further comprising:
forming a predetermined film on the first main surface of the substrate to be processed,
wherein the exposing of the silicon-containing surface at the circumferential edge portion of the first main surface of the substrate to be processed, comprises removing the predetermined film on the substrate to be processed.

4. The method for processing a substrate according to claim 3, the exposing of the silicon-containing surface exposes silicon by coating a predetermined chemical solution on a second main surface on an opposite side of the first main surface, causing the chemical solution to go around from an edge of the circumferential edge portion of the substrate to be processed to the circumferential edge portion on the first main surface, and removing the predetermined film at the circumferential edge portion of the first main surface of the substrate to be processed by the chemical solution, and the forming of the film decreases film thickness of the predetermined film on the first main surface and forms the film including SiOCFn or SiCFn, where n is an integer that is one or more, by bonding the silicon, the carbon, and the fluorine together at the circumferential edge portion of the first main surface, using the CF based gas or the CF based solvent.

5. The method for processing a substrate according to claim 3, wherein the predetermined film is an insulating film.

6. The method for processing a substrate according to claim 1,
the method further comprising performing dehydrating-high-temperature-heat processing to the substrate to be processed between the exposing of the silicon-containing surface at the circumferential edge portion of the first main surface of the substrate to be processed and the forming of the film.

7. The method for processing a substrate according to claim 1,
the forming of the film comprising forming the film on a part of the circumferential edge portion or the entire circumferential edge portion of the substrate to be processed while rotating the substrate to be processed.

8. A method for processing a substrate, comprising:
exposing a silicon-containing surface at a circumferential edge portion of a first main surface of a substrate to be processed;
performing surface processing to the silicon-containing surface to increase a contact angle of the silicon-containing surface with respect to a resist material, comparing with the contact angle before the surface processing is performed;
supplying the resist material onto the substrate to be processed after the surface processing; and
transferring a template pattern to the resist material, wherein
the surface processing comprises forming a film on the silicon-containing surface; and
the forming of the film forms the film containing SiOCFn or SiCFn, where n is an integer that is one or more, at the circumferential edge portion that has not been covered with a shielding member, using CF based gas or a CF based solvent in a state where the shielding member is arranged on the first main surface of the substrate to be processed, the shielding member being configured to shield an inner circumferential side of the circumferential edge portion of the first main surface of the substrate to be processed.

9. The method for processing a substrate according to claim 8, further comprising:
forming a predetermined film on the first main surface of the substrate to be processed,
wherein the exposing of the silicon-containing surface at the circumferential edge portion of the first main surface of the substrate to be processed, comprises removing the predetermined film on the substrate to be processed.

10. The method for processing a substrate according to claim 9,
wherein the surface processing comprises forming the film on the silicon-containing surface, the film being formed by bonding silicon, carbon and fluorine, or being formed by bonding silicon, oxygen, carbon and fluorine,
the exposing of the silicon-containing surface exposes silicon by coating a predetermined chemical solution on a second main surface on an opposite side of the first main surface, causing the chemical solution to go around from an edge of the circumferential edge portion of the substrate to be processed to the circumferential edge portion on the first main surface, and removing the predetermined film at the circumferential edge portion of the first main surface of the substrate to be processed by the chemical solution, and the forming of the film decreases film thickness of the predetermined film on the first main surface and forms the film including SiOCFn or SiCFn, where n is an integer that is one or more, by bonding the silicon, the carbon, and the fluorine together at the circumferential edge portion of the first main surface, using CF based gas or a CF based solvent.

11. A method for processing a substrate, comprising:
exposing a silicon-containing surface at a circumferential edge portion of a first main surface of a substrate to be processed;
performing surface processing to the silicon-containing surface to increase a contact angle of the silicon-containing surface with respect to a resist material, comparing with the contact angle before the surface processing is performed;
supplying the resist material onto the substrate to be processed after the surface processing;
transferring a template pattern to the resist material; and
forming a predetermined film on the first main surface of the substrate to be processed,
wherein
the exposing of the silicon-containing surface at the circumferential edge portion of the first main surface of the substrate to be processed, comprises removing the predetermined film on the substrate to be processed,
the surface processing comprises forming a film on the silicon-containing surface, the film being formed by bonding silicon, carbon and fluorine, or being formed by bonding silicon, oxygen, carbon and fluorine,
the exposing of the silicon-containing surface exposes silicon by coating a predetermined chemical solution on a second main surface on an opposite side of the first main surface, causing the chemical solution to go around from an edge of the circumferential edge portion of the substrate to be processed to the circumferential edge portion on the first main surface, and removing the predetermined film at the circumferential edge portion of the first main surface of the substrate to be processed by the chemical solution, and
the forming of the predetermined film decreases film thickness of the predetermined film on the first main surface and forms the film including SiOCFn or SiCFn, where n is an integer that is one or more, by bonding the silicon, the carbon, and the fluorine together at the circumferential edge portion of the first main surface, using CF based gas or a CF based solvent.

* * * * *